(12) United States Patent
Shimada et al.

(10) Patent No.: US 7,731,339 B2
(45) Date of Patent: Jun. 8, 2010

(54) PIEZOELECTRIC ELEMENT, ACTUATOR DEVICE, LIQUID EJECTING HEAD AND LIQUID EJECTING APPARATUS

(75) Inventors: Masato Shimada, Chino (JP); Xin-Shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 477 days.

(21) Appl. No.: 11/835,218

(22) Filed: Aug. 7, 2007

(65) Prior Publication Data

US 2008/0043069 A1 Feb. 21, 2008

(30) Foreign Application Priority Data

Aug. 8, 2006 (JP) ............... 2006-216132

(51) Int. Cl.
*B41J 2/045* (2006.01)
(52) U.S. Cl. ........................................ 347/70
(58) Field of Classification Search ............ 347/72, 347/68–71; 400/124.14–124.16; 310/363–366, 310/324
See application file for complete search history.

(56) References Cited

U.S. PATENT DOCUMENTS

| 2002/0097305 A1* | 7/2002 | Sumi ............... 347/68 |
| 2006/0170736 A1* | 8/2006 | Tomozawa et al. ...... 347/71 |
| 2007/0097182 A1* | 5/2007 | Kubota et al. ......... 347/70 |

FOREIGN PATENT DOCUMENTS

JP    11-151815    6/1999

* cited by examiner

*Primary Examiner*—K. Feggins
(74) *Attorney, Agent, or Firm*—Workman Nydegger

(57) ABSTRACT

A piezoelectric element includes a lower electrode film disposed on a substrate, a piezoelectric layer 70 disposed on the lower electrode film, a upper electrode film 80 disposed on the piezoelectric layer 70, wherein the piezoelectric layer 70 is formed of a plurality of columnar grains 70a, and the upper electrode film 80 conforms to the surface shape of each of the grains 70a of the piezoelectric layer 70.

8 Claims, 4 Drawing Sheets

(a)

(b)

PIEZOELECTRIC ELEMENT, ACTUATOR DEVICE, LIQUID EJECTING HEAD AND LIQUID EJECTING APPARATUS

BACKGROUND

1. Technical Field

The present invention relates to a piezoelectric element including a lower electrode film, a piezoelectric layer composed of a piezoelectric material, and an upper electrode film, an actuator device including the piezoelectric element that can be flexurally deformed, a liquid ejecting head including the actuator device, and a liquid ejecting apparatus.

2. Related Art

An example of piezoelectric elements used for actuator devices and the like is an element in which a piezoelectric layer composed of a piezoelectric material, such as a crystallized piezoelectric ceramic material, having the function of electromechanical transduction, is disposed between two electrodes: an lower electrode film and an upper electrode film. Examples of actuator devices including piezoelectric elements, i.e., actuator devices that vibrate in a flexural mode, include a liquid ejecting head that ejects droplets from nozzle openings utilizing the displacement of the piezoelectric elements. A typical example of a liquid ejecting head is an ink jet recording head that includes a diaphragm constituting part of a pressure-generating chamber communicating with a nozzle opening for ejection of ink droplets and that ejects ink droplets from the nozzle opening by deforming the diaphragm with the piezoelectric element to pressurize ink in the pressure-generating chamber.

An example of piezoelectric elements used for ink jet recording heads is an element described in Japanese Unexamined Patent Application Publication No. 11-151815, the element being produced by forming a piezoelectric film and an upper electrode film by a film-forming technique on the entire surface of a substrate provided with a lower electrode and cutting the piezoelectric layer and the upper electrode film by lithography into pieces each having a shape corresponding to a pressure-generating chamber.

In piezoelectric elements used for such ink jet recording heads and the like, repeated operations may cause problems, e.g., delamination. Specifically, problems such as the detachment of the upper electrode film from the piezoelectric element layer and the formation of a crack may be caused.

Such problems are present not only in piezoelectric elements used for actuator devices incorporated in liquid ejecting heads such as ink jet recording heads but also piezoelectric elements used for other apparatuses.

SUMMARY

The present invention has been made in light of the above-described situation. It is an object of the present invention to provide a piezoelectric element having improved adhesion between an upper electrode film and a piezoelectric layer, an actuator device, a liquid ejecting head, and liquid ejecting apparatus.

To overcome the above-described problems, according to a first aspect of the present invention, a piezoelectric element includes a lower electrode film disposed on a substrate, a piezoelectric layer disposed on the lower electrode film, and an upper electrode film disposed on the piezoelectric layer, wherein the piezoelectric layer is formed of columnar grains, and the upper electrode film conforms to the surface shape of each of the grains of the piezoelectric layer.

In the first aspect, the adhesion between the upper electrode film and the piezoelectric layer is improved, thereby preventing the delamination of the upper electrode film and the formation of a crack due to repeated operations of the piezoelectric element.

According to a second aspect of the present invention, the piezoelectric element described in the first aspect is characterized in that the average grain size of the upper electrode film is ¼ or less of $(m-2\sigma)$ where m represents the average grain size of the piezoelectric layer and $\sigma$ represents the standard deviation of a normal distribution function.

In the second aspect, the grains of the upper electrode film are relatively small, thereby further improving the adhesion between the upper electrode film and the piezoelectric layer.

According to a third aspect of the present invention, the piezoelectric element described in the second aspect is characterized in that the average grain size of the upper electrode film is 1/10 or less of $(m-2\sigma)$.

In the third aspect, the grains of the upper electrode film are relatively small, thereby further improving the adhesion between the upper electrode film and the piezoelectric layer.

According to a fourth aspect of the present invention, the piezoelectric element described in any one of the first to third aspects is characterized in that the upper electrode film has a thickness of 10 to 200 nm.

In the fourth aspect, the adhesion between the upper electrode film and the piezoelectric layer can be improved while a satisfactory electrical conductivity of the upper electrode film is ensured.

According to a fifth aspect of the present invention, the piezoelectric element described in any one of the first to fourth aspects is characterized in that the upper electrode film is composed of a material containing at least one selected from the group consisting of iridium, platinum, ruthenium, palladium, rhodium, rhenium, osmium, and gold.

In the fifth aspect, the adhesion between the upper electrode film and the piezoelectric layer can be surely improved while a satisfactory electrical conductivity of the upper electrode film is ensured.

According to a sixth aspect of the present invention, an actuator device includes the piezoelectric element described in any one of the first to fifth aspects, wherein the piezoelectric element can be flexurally deformed.

In the sixth aspect, the actuator device having improved durability can be provided while satisfactory displacement properties of the piezoelectric element are maintained.

According to a seventh aspect of the present invention, a liquid ejecting head includes the actuator device described in the sixth aspect and a channel-forming substrate having the actuator device arranged on one surface side and having a pressure-generating chamber communicating with a nozzle opening for ejection of droplets.

In the seventh aspect, the liquid ejecting head having improved durability can be provided while droplet-ejecting properties are satisfactorily maintained.

According to an eighth aspect, a liquid ejecting apparatus includes the liquid ejecting head described in the seventh aspect.

In the eighth aspect, the liquid ejecting apparatus having excellent reliability and durability can be provided.

DESCRIPTION OF EXEMPLARY EMBODIMENTS

The present invention will be described in detail below on the basis of embodiments.

Figure 1:
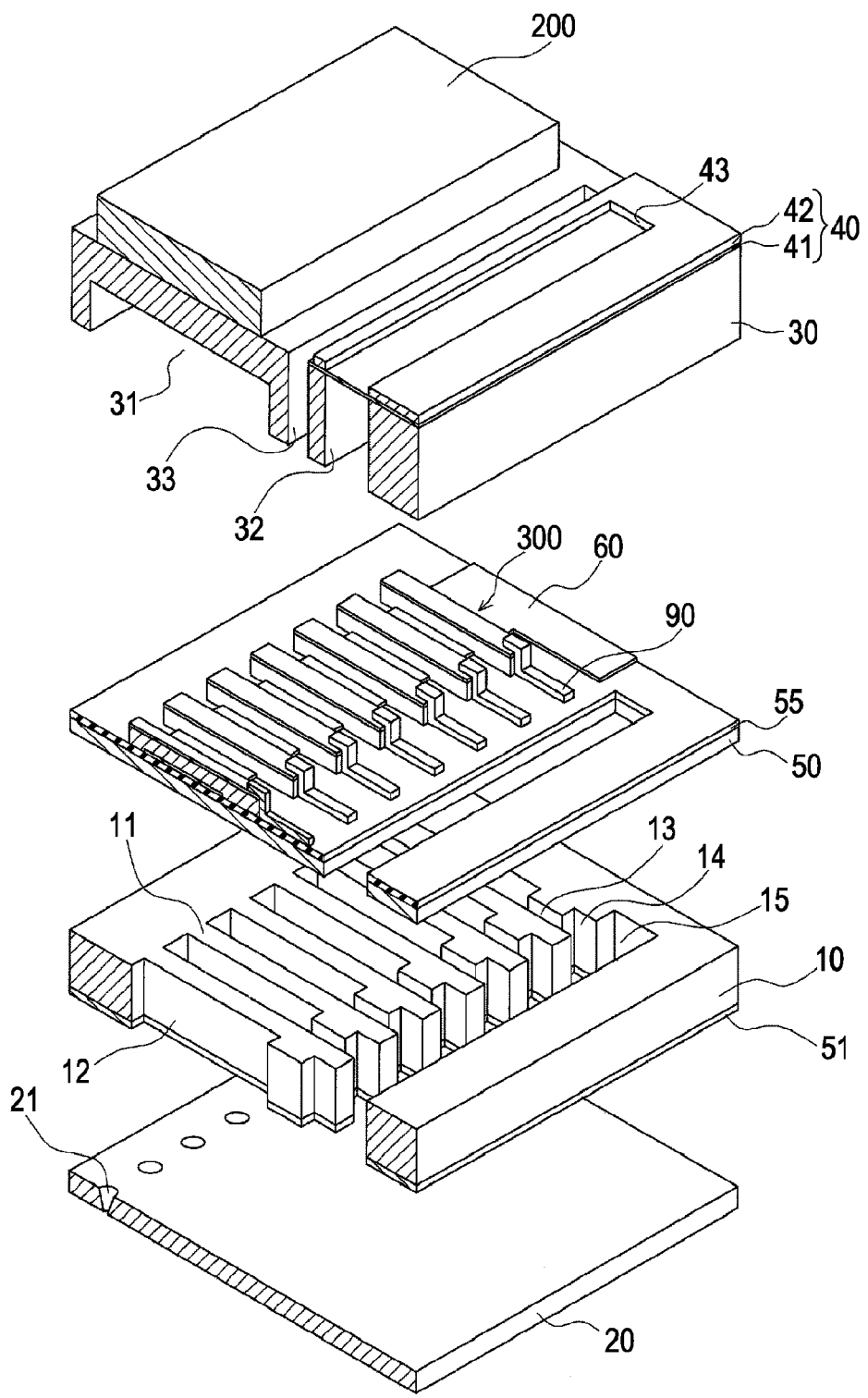
FIG. 1 is an exploded perspective view illustrating a schematic structure of a recording head according to an embodiment of the present invention.
Figure 2:
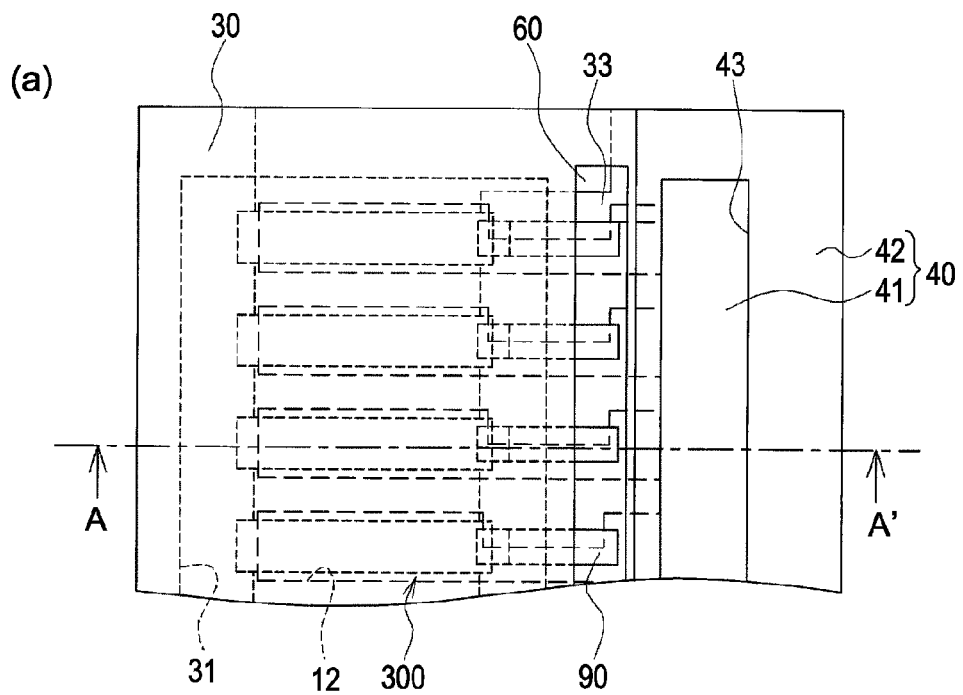
FIG. 2 shows a plan view and a cross-sectional view of a recording head according to an embodiment of the present invention.
Figure 2:
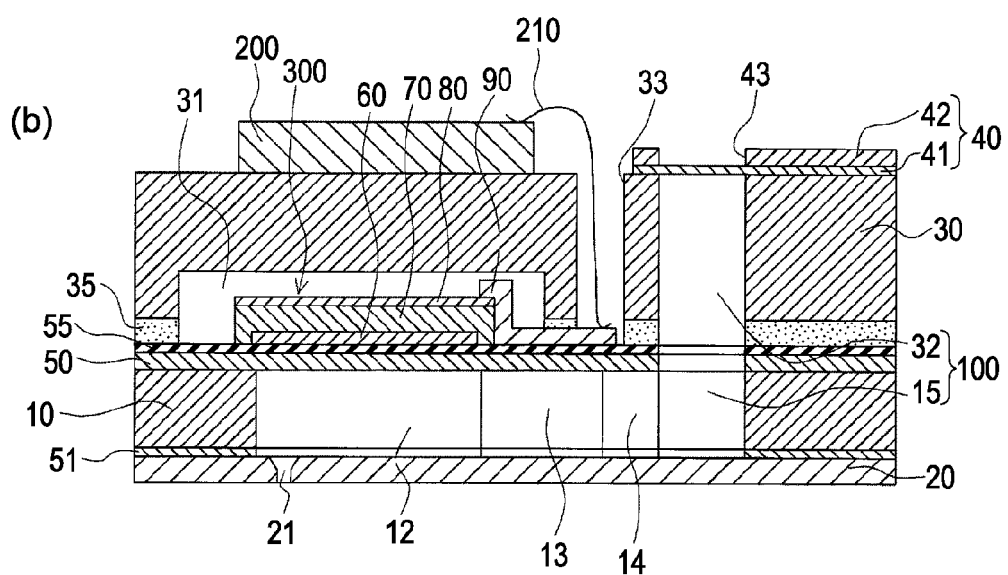
Figure 3:
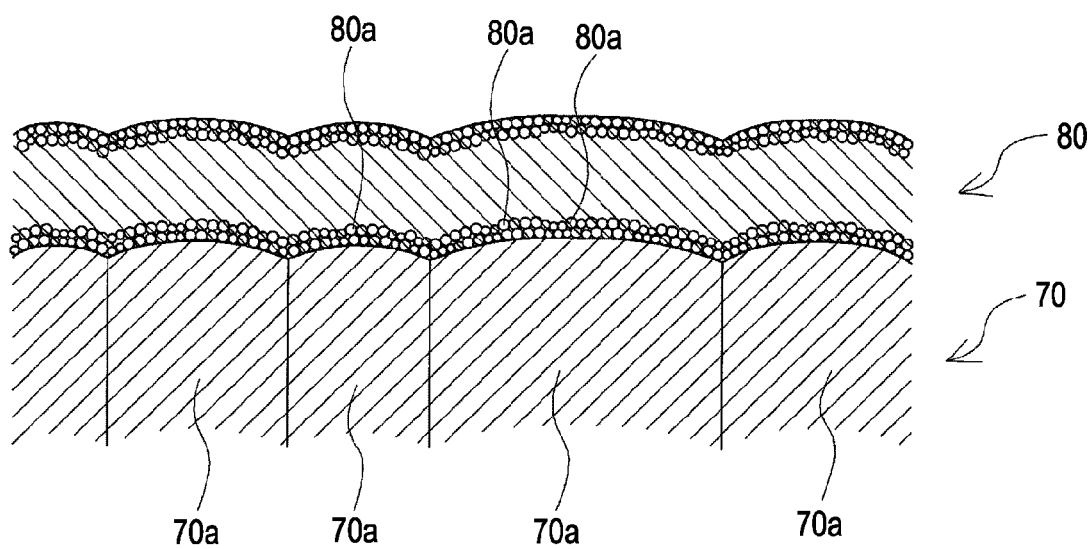
FIG. 3 is an enlarged schematic view illustrating the crystalline state of a piezoelectric element according to an embodiment of the present invention.

FIG. 1 is an exploded perspective view illustrating a schematic structure of an ink jet recording head as an example of a liquid ejecting head according to an embodiment of the present invention. FIG. 2 shows a plan view of FIG. 1 and a cross-sectional view taken along line A-A'. FIG. 3 is a schematic cross-sectional view of the crystalline state of a piezoelectric element.

As shown in the figures, a channel-forming substrate 10 is made of a (110) oriented single-crystal silicon substrate in this embodiment. A resilient film 50 composed of silicon oxide ($SiO_2$) formed by thermal oxidation in advance and having a thickness of 0.5 to 2.0 [μm] is formed on one surface thereof. The channel-forming substrate 10 includes a plurality of pressure-generating chambers 12 partitioned with partitions 11 and arranged in the width direction thereof.

An ink supply channel 13 and a communicating channel 14 that are partitioned with the partitions 11 are formed on an end side of each of the pressure-generating chambers 12 in the longitudinal direction. A communicating portion 15 that communicates with the communicating channels 14 is formed on the outer side of the communicating channels 14. The communicating portion 15 communicates with a reservoir portion 32 in a protective substrate 30 described below and partially constitutes a reservoir 100 serving as a common ink chamber (liquid chamber) for each of the pressure-generating chambers 12.

Each ink supply channel 13 is formed so as to have a cross-sectional area smaller than that of a corresponding one of the pressure-generating chamber 12 to maintain ink-flow resistance from the communicating portion 15 to each pressure-generating chamber 12 at a constant level. For example, in this embodiment, the width of a passage between the reservoir 100 and each pressure-generating chamber 12 is reduced on the side of the pressure-generating chamber 12 to form the corresponding ink supply channel 13 having a width smaller than that of the pressure-generating chamber 12. In this embodiment, the width of the passage is reduced from one side to form the ink supply channel. Alternatively, the width of the passage may be reduced from both sides to form the ink supply channel. Furthermore, the passage is not reduced in width but may be reduced in the thickness direction. The partitions 11 arranged on both sides of a corresponding one of the pressure-generating chambers 12 in the width direction extend to the communicating portion 15 to partition a space between the ink supply channel 13 and the communicating portion 15, thereby resulting in the corresponding communicating channel 14.

A nozzle plate 20 having nozzle openings 21 each communicating with a position in the vicinity of an end of each pressure-generating chamber 12 opposite the ink supply channel 13 is fixed to the opening side of the channel-forming substrate 10 with an adhesive or a heat-sealing film via a protective film 51 used as a mask during the formation of the pressure-generating chambers 12. The nozzle plate 20 is formed of, for example, a glass ceramic material, a single-crystal silicon substrate, or stainless steel.

As described above, the resilient film 50 having a thickness of, for example, about 1.0 [μm] is formed on the side opposite the opening side of the channel-forming substrate 10. An insulating film 55 composed of zirconium oxide or the like and having a thickness of, for example, about 0.4 [μm] is formed on the insulating film 55. Piezoelectric elements 300 each including a lower electrode film 60 having a thickness of, for example, about 0.1 to 0.2 μm [μm], a piezoelectric layer 70 having a thickness of, for example, about 0.5 to 5 [μm], and an upper electrode film 80 having a thickness of, for example, about 50 [nm] are formed on the insulating film 55. The term "piezoelectric elements 300" refer to portions each including the lower electrode film 60, the piezoelectric layer 70, and the upper electrode film 80. In general, one of the electrodes of each piezoelectric element 300 is used as a common electrode. The other electrode is patterned together with the piezoelectric layer 70 from one pressure-generating chamber 12 to another, thereby forming individual electrodes. For example, in this embodiment, the lower electrode film 60 is used as a common electrode of the piezoelectric elements 300. The upper electrode film 80 is used as an individual electrode of each piezoelectric element 300. Due to a driving circuit or interconnections, this structure may be successfully reversed. A combination of each piezoelectric element 300 and a diaphragm that is deformed by the operation of the piezoelectric element 300 is referred to as an actuator device. In the above-described embodiment, the resilient film 50, the insulating film 55, and the lower electrode film 60 serve as the diaphragm. Alternatively, only the lower electrode film 60 may serve as the diaphragm without the formation of the resilient film 50 or the insulating film 55. Furthermore, the piezoelectric element 300 in itself may also substantially serve as the diaphragm.

The upper electrode film 80 of each piezoelectric element 300 is connected to a lead electrode 90 composed of, for example, gold (Au). A voltage is selectively applied to each piezoelectric element 300 through the corresponding lead electrode 90.

The lower electrode film 60 constituting the common electrode of the piezoelectric elements 300 is continuously formed in a region corresponding to the plurality of piezoelectric elements 300. Examples of the lower electrode film 60 that can be suitably used include, but are not particularly limited to, platinum (Pt) and Iridium (Ir). For example, in this embodiment, sputtering is performed with platinum and iridium to form a laminated layer as the lower electrode film 60.

The piezoelectric layers 70 are composed of a piezoelectric material such as lead zirconate titanate (PZT). In this embodiment, the piezoelectric layers 70 are formed by a sol-gel method in which a solution or dispersion of organometallic compounds in a catalyst, i.e., sol, is applied and dried to form a gel and then the gel is fired at a high temperature to form the piezoelectric layer 70 composed of a metal oxide.

The method for producing the piezoelectric layers 70 is not limited to the sol-gel method. For example, metal-organic decomposition (MOD) may be employed. As a material of the piezoelectric layers 70, a relaxer ferroelectric material that is a ferroelectric piezoelectric material, such as lead zirconate titanate (PZT), doped with a metal, such as niobium, nickel, magnesium, bismuth, or yttrium, may be used. The composition may be appropriately selected in view of the characteristics, applications, and the like of the piezoelectric element. Examples thereof include $PbTiO_3$ (PT), $PbZrO_3$ (PZ), $Pb(Zr_xTi_{1-x})O_3$ (PZT), $Pb(Mg_{1/3}Nb_{2/3})O_3$—$PbTiO_3$ (PMN- PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/3}Ta_{2/3})O_3$—$PbTiO_3$ (PST-PT), $Pb(Sc_{1/3}Nb_{2/3})O_3$—$PbTiO_3$ (PSN-PT), $BiScO_3$—$PbTiO_3$ (BS-PT), and $BiYbO_3$—$PbTiO_3$ (BY-PT). The method for producing the piezoelectric layers 70 is not limited to the sol-gel method or MOD. The piezoelectric layers 70 may be formed by sputtering. That is, any of thin-film-forming methods may be employed as the method for producing the piezoelectric layers 70.

In the present invention, as shown in FIG. 3, the piezoelectric layer 70 constituting each piezoelectric element 300 has columnar grains 70a and the preferred orientation of the grains 70a. The term "preferred orientation" refers to a state in which the orientation direction of the grains is not random but in which a specific crystal plane faces in substantially the same direction. A thin film having the columnar grains means a state in which substantially columnar grains are aligned in the planar direction to form a thin film while the central axes of the grains correspond substantially to the thickness direction.

As shown in FIG. 3, each of the upper electrode films 80 is formed so as to conform to the surface shape of the columnar grain 70a of the corresponding piezoelectric layer 70. In other words, macroscopically, the upper electrode film 80 formed on each piezoelectric layer 70 has a substantially flat surface. However, the upper electrode film 80 has a microscopically irregular surface along the uneven surfaces of the grains 70a. Grains 80a of the upper electrode film 80 are in the form of, for example, granules. Most of the grains 80a have grain sizes significantly smaller than those of the grains 70a of the piezoelectric layer 70. The upper electrode film 80 on each grain 70a of the piezoelectric layer 70 is constituted by the plurality of grains 80a. Thus, the upper electrode film 80 has a shape that conforms to the surface shape of the piezoelectric layer 70. In FIG. 3, only the grains 80a located near both surfaces of the upper electrode film 80 are illustrated but are omitted in the other region between the surfaces.

In this way, each of the upper electrode films 80 is formed so as to conform to the surface shape of the columnar grain 70a of the corresponding piezoelectric layer 70, thereby improving the adhesion between each upper electrode film 80 and the corresponding piezoelectric layer 70. This prevents the delamination and the formation of a crack in the upper electrode films 80 during the operation of the piezoelectric elements 300.

The surfaces of each piezoelectric layer 70 located on grain boundaries between the grains 70a are often depressed. If the grains 80a of the upper electrode film 80 have large grain sizes, the upper electrode film 80a may not be formed so as to be in close contact with the depressed region. Therefore, most of the grains 80a of the upper electrode films 80 need to have grain sizes significantly smaller than those of the grains 70a of the piezoelectric layers 70.

Accordingly, with respect to the average grain size (average value of the grain sizes) of each upper electrode film 80, for example, let the average grain size of the piezoelectric layers 70 be m, and let the standard deviation of a normal distribution function be $\sigma$. In this case, the average grain size of each upper electrode film 80 is preferably ¼ or less and particularly preferably 1/10 or less of (m−2σ). In the present invention, the term "grain size" of the piezoelectric layer refers to the diameter of the columnar grain on the end face side, i.e., the grain size on the surface (upper electrode film) side. The grain sizes and the average grain sizes of the grains of the piezoelectric layers and the underlying electrode layers are determined by image analysis of grain images photographed with a scanning electron microscope (SAEM).

For example, with respect to the grain sizes of each piezoelectric layer 70 according to this embodiment, the largest grain size is about 220 [nm]. The smallest grain size is about 20 [nm]. The average grain size m is determined to be 109 [nm]. The standard deviation $\sigma$ is 38.5 [nm]. Thus, (m−2σ) =32.1 [nm]. In this embodiment, therefore, the average grain size of each upper electrode film 80 is preferably about 8.0 [nm] or less and particularly preferably about 3.2 [nm] or less.

Thus, in the case where the average grain size of each upper electrode film 80 is ¼ or less of (m−2σ), the upper electrode film 80 is formed so as to conform to the surface shape of the corresponding piezoelectric layer 70, thereby further improving adhesion. When each of the grains 80a of the upper electrode films 80 has the above-described size, each grain 80a has a size smaller than each grain of the piezoelectric layers 70. As described above, each upper electrode film 80 on the grains 70a of the piezoelectric layer 70 is surely constituted by the plurality of grains 80a. Therefore, the upper electrode films 80 are formed extremely satisfactorily so as to conform to the surface shapes of the grains of the piezoelectric layers.

Approximately 95.4% of the grain sizes of the grains constituting the piezoelectric layers 70 are included in the range of (m±2σ). Approximately 2% to 3% of the grains having grain sizes smaller than (m−2σ) are present. Thus, even if the piezoelectric layer 70 contains extremely small sized grains, and even if the upper electrode film 80 does not conform to the surfaces of the small grains, the adhesion between the upper electrode film 80 and the piezoelectric layer 70 is not substantially affected.

The thickness of each upper electrode film 80 is not particularly limited but is preferably in the range of 10 to 200 [nm]. When the upper electrode film 80 has a thickness of less than 10 [nm], electrical conductivity is excessively low; hence, the piezoelectric element 300 may not operate satisfactorily. When the upper electrode film 80 has a thickness exceeding 200 [nm], the amount of the displacement of the piezoelectric element 300 may be reduced, or delamination or the like may be caused by the stress of the upper electrode film 80.

The material of the upper electrode film 80 is not particularly limited as long as it has high electrical conductivity. For example, preferably, the material is a material containing at least one selected from the group consisting of iridium (Ir), platinum (Pt), ruthenium (Ru), palladium (Pd), rhodium (Rh), rhenium (Re), osmium (Os), and gold (Au). The upper electrode film 80 may be composed of one of the above-described materials. Alternatively, the upper electrode film 80 may be composed of an alloy mainly containing any of the above-described materials. Thereby, it is possible to surely form the upper electrode film 80 having improved adhesion to the piezoelectric layer 70 while satisfactory electrical conductivity is ensured.

The protective substrate 30 having a piezoelectric-element-holding portion 31 for protecting the piezoelectric elements 300 is bonded to the channel-forming substrate 10 having the piezoelectric elements 300, i.e., having the lower electrode film 60, the resilient film 50, and the lead electrodes 90, with an adhesive 35 or the like. A space defined by the piezoelectric-element-holding portion 31 may be sealed or not The protective substrate 30 has the reservoir portion 32 at least partially constituting the reservoir 100 that stores ink to be fed into the plurality of pressure-generating chambers 12. In this embodiment, the reservoir portion 32 extends in the width direction of the pressure-generating chambers 12 and passes through the protective substrate 30 in the thickness direction. As described above, the reservoir portion 32 communicates with the communicating portion 15 of the channel-forming substrate 10 to form the reservoir 100.

The protective substrate 30 is preferably composed of a material, such as a glass material or a ceramic material, having substantially the same thermal expansion coefficient as the channel-forming substrate 10. In this embodiment, a single-crystal silicon substrate that is composed of the same material as that of the channel-forming substrate 10 is used.

The protective substrate 30 has a through hole 33 passing through the protective substrate 30 in the thickness direction. An end of each lead electrode 90 connected to the corresponding piezoelectric element 300 is exposed in the through hole 33. A driving circuit 200, e.g., a circuit board and a semiconductor integrated circuit (IC), for driving the piezoelectric elements 300 is fixed to the protective substrate 30. The driving circuit 200 is electrically connected to the lead electrodes 90 with interconnections 210 formed of conductive wires such as bonding wires extending through the through hole 33.

A compliance substrate 40 formed of a sealing film 41 and a fixing plate 42 is attached to the protective substrate 30. The sealing film 41 is composed of a low-stiffness, flexible material (e.g., polyphenylene sulfide (PPS) film having a thickness of 6 [μm]). An end of the reservoir portion 32 is sealed with the sealing film 41. The fixing plate 42 is composed of a hard material such as a metal (e.g., stainless steel (SUS) plate having a thickness of 30 [μm]). A region of the fixing plate 42 opposite the reservoir 100 is completely removed in the thickness direction to form an opening 43. That is, an end of the reservoir 100 is sealed with the flexible sealing film 41 alone.

In the ink jet recording head according to this embodiment, ink is fed from an ink supply port connected with an external ink supply means (not shown) to fill a region from the reservoir 100 to the nozzle openings 21 with ink. Then, according to a recording signal form the driving circuit 200, a voltage is applied between the lower electrode film 60 and the upper electrode film 80 corresponding to each of the pressure-generating chambers 12 to flexurally deform the piezoelectric elements 300, thereby increasing the pressure in the pressure-generating chambers 12 to eject ink droplets from the nozzle openings 21.

Figure 4:
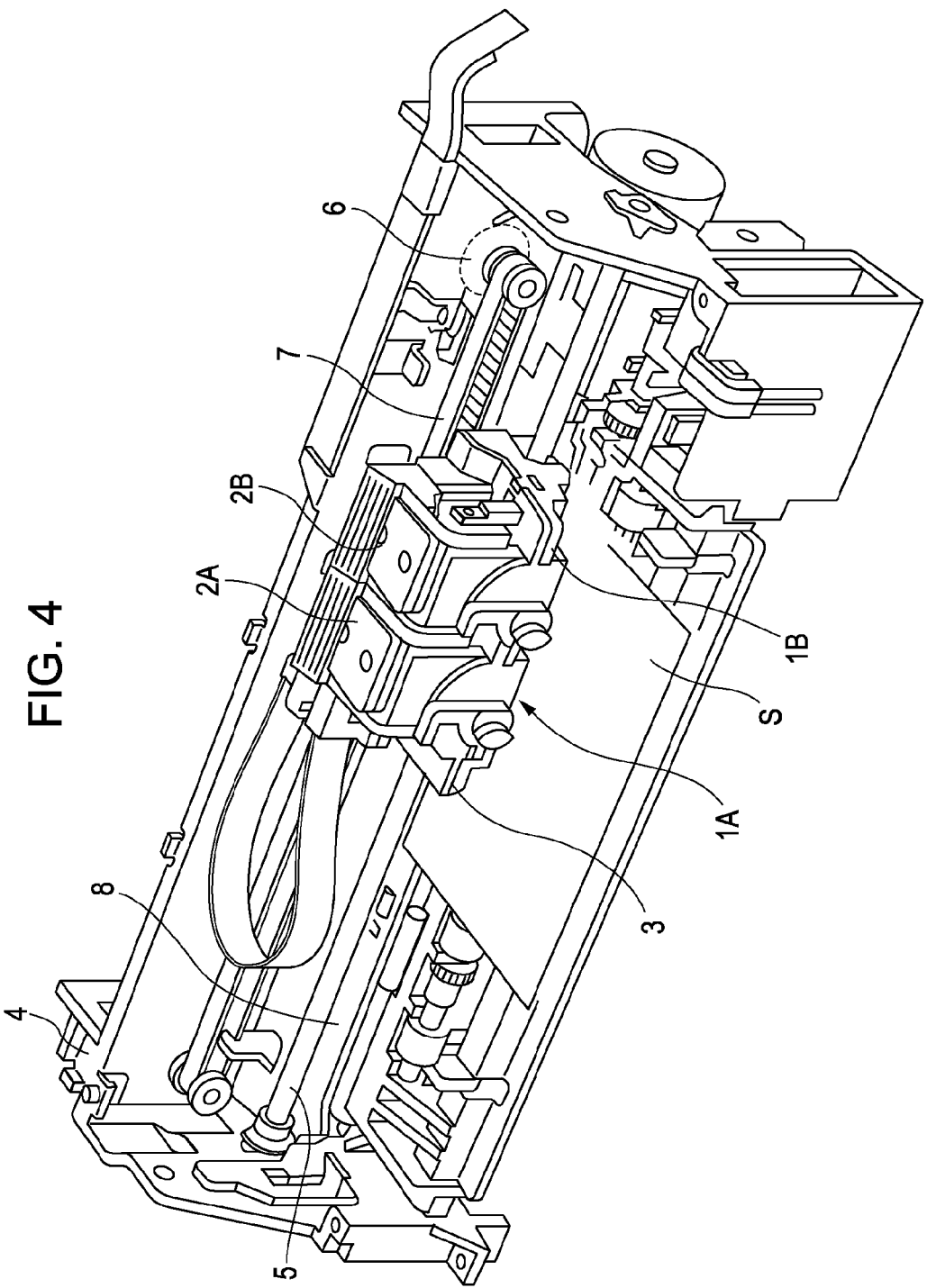
FIG. 4 is a schematic view of a recording apparatus according to an embodiment of the present invention.

Such an ink jet recording head partially constitutes a recording head unit including ink channels communicating with ink cartridges and is mounted on an ink jet recording apparatus. FIG. 4 is a schematic view of an example of the ink jet recording apparatus. As shown in FIG. 4, cartridges 2A and 2B constituting ink supply means are detachably arranged to recording head units 1A and 1B including ink jet recording heads. A carriage 3 on which the recording head units 1A and 1B are mounted is movably attached to a carriage shaft 5 in the axial direction, the carriage shaft 5 being mounted to a main body 4. The recording head units 1A and 1B can eject a black ink composition and a color ink composition, respectively.

The driving force of a driving motor 6 is transmitted to the carriage 3 via a plurality of gears and a timing belt 7, thereby moving the carriage 3 on which the recording head units 1A and 1B are mounted along the carriage shaft 5. The main body 4 is provided with a platen 8 along the carriage shaft 5. A recording sheet S such as paper fed with feed rollers (not shown) is transported on the platen 8.

The embodiment of the present invention has been described above. However, the present invention is not limited to this embodiment. For example, in this embodiment, the ink jet recording head has been described as an example of a liquid ejecting head. The present invention can be applied to the overall liquid ejecting heads. Of course the present invention can be applied to liquid ejecting heads that eject liquids other than ink. Examples of another liquid ejecting head include various recording heads used for image-recording apparatus such as printers; colorant-ejecting heads used for the production of color filters for liquid crystal displays; electrode-material-ejecting heads used for forming electrodes for organic EL displays and field-emission displays; and bioorganic-material-ejecting heads used for the production of biochips. Furthermore, the present invention can be applied to actuator devices mounted on all apparatuses as well as actuator devices as pressure-generating means mounted on the liquid ejecting heads. For example, the actuator devices can be applied to sensors as well as the heads described above. Moreover, the present invention can be applied to piezoelectric elements mounted on any other devices, such as microphones, sounding bodies, various vibrators, and resonators, as well as piezoelectric elements as actuator devices used for liquid ejecting heads.

What is claimed is:

1. A piezoelectric element comprising a lower electrode film disposed on a substrate, a piezoelectric layer disposed on the lower electrode film, and an upper electrode film disposed on the piezoelectric layer, wherein the piezoelectric layer is formed of columnar grains, and the upper electrode film conforms to the surface shape of each of the grains of the piezoelectric layer.

2. The piezoelectric element according to claim 1, wherein the average grain size of the upper electrode film is ¼ or less of $(m-2\sigma)$ where m represents the average grain size of the piezoelectric layer and $\sigma$ represents the standard deviation of a normal distribution function.

3. The piezoelectric element according to claim 2, wherein the average grain size of the upper electrode film is ¹⁄₁₀ or less of $(m-2\sigma)$.

4. The piezoelectric element according to claim 1, wherein the upper electrode film has a thickness of 10 to 200 nm.

5. The piezoelectric element according to claim 1, wherein the upper electrode film is composed of a material containing at least one selected from the group consisting of iridium, platinum, ruthenium, palladium, rhodium, rhenium, osmium, and gold.

6. An actuator device comprising the piezoelectric element according to claim 1, wherein the piezoelectric element can be flexurally deformed.

7. A liquid ejecting head comprising the actuator device according to claim 6 and a channel-forming substrate having the actuator device arranged on one surface side and having a pressure-generating chamber communicating with a nozzle opening for ejection of droplets.

8. A liquid ejecting apparatus comprising the liquid ejecting head according to claim 7.

* * * * *